United States Patent
Chang et al.

(10) Patent No.: US 8,477,058 B2
(45) Date of Patent: Jul. 2, 2013

(54) SUCCESSIVE APPROXIMATION ANALOG TO DIGITAL CONVERTER WITH A DIRECT SWITCHING TECHNIQUE FOR CAPACITOR ARRAY THROUGH COMPARATOR OUTPUT AND METHOD THEREOF

(75) Inventors: Soon-Jyh Chang, Tainan (TW); Guan-Ying Huang, Tainan (TW); Chung-Ming Huang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 99 days.

(21) Appl. No.: 13/272,110

(22) Filed: Oct. 12, 2011

(65) Prior Publication Data

US 2013/0093609 A1    Apr. 18, 2013

(51) Int. Cl.
*H03M 1/34* (2006.01)

(52) U.S. Cl.
USPC .......................................... 341/163; 341/141

(58) Field of Classification Search
USPC ................. 341/155, 161, 163, 144, 141, 172
See application file for complete search history.

(56) References Cited

U.S. PATENT DOCUMENTS

| | | | |
|---|---|---|---|
| 7,026,975 B1 * | 4/2006 | Steward et al. | 341/161 |
| 7,839,319 B2 * | 11/2010 | Nittala et al. | 341/162 |
| 8,159,382 B2 * | 4/2012 | Srinivasa et al. | 341/156 |
| 2009/0273501 A1 * | 11/2009 | Madhavan et al. | 341/158 |

* cited by examiner

*Primary Examiner* — Peguy Jean Pierre
(74) *Attorney, Agent, or Firm* — Stout, Uxa, Buyan & Mullins, LLP

(57) ABSTRACT

A method for a successive approximation register ADC which includes at least one capacitor array and a plurality of switches is provided, in which the capacitors of the capacitor array are one-to-one corresponding to the switches. The method includes the following steps: firstly, at least one multiplexer is configured. Then, a first comparison voltage is outputted based on the terminal voltages on the terminals of the capacitor array, and a comparison result is outputted according to the first comparison voltage and a second comparison voltage. Afterwards, a sequence of comparisons is controlled based on the comparison result to enter into a sequence of comparison phases. Finally, the switches are orderly selected, by the multiplexer based on the comparison phases, to switch directly according to the comparison result.

14 Claims, 6 Drawing Sheets

$C_{i+1} = 2C_i$ and $C_1 = C_0$, where $i = 1 \sim 8$

US 8,477,058 B2

SUCCESSIVE APPROXIMATION ANALOG TO DIGITAL CONVERTER WITH A DIRECT SWITCHING TECHNIQUE FOR CAPACITOR ARRAY THROUGH COMPARATOR OUTPUT AND METHOD THEREOF

BACKGROUND OF THE INVENTION

1. Field of the Invention

The present invention generally relates to a successive approximation register (SAR) ADC, and more particularly to a successive approximation ADC for increasing conversion rate by a direct switching technique for capacitor array through comparator output and method thereof.

2. Description of Related Art

FIG. 1 illustrates a conventional 10-bit successive approximation register (SAR) analog-to-digital converter (ADC). As shown in FIG. 1, SAR ADC 1 includes two symmetrical digital to analog converters (DACs) 11, 13 which both consist of a capacitor array ($C_9$ to $C_0$) with binary weighted values. In operation, a comparator 15 first samples and compares the differential input voltages $V_{ip}$, $V_{in}$, and a SAR control logic ("SAR") 17 switches the switches $S_{P9}$, $S_{N9}$ to control the terminal voltages on. the terminals of the capacitors $C_9$ based on a comparison result of the comparator 15. Due to the change of the terminal voltages, the redistributed charges generate new voltages on the two terminals of the DACs 11, 13. Then, the comparator 15 compares the outputs of the DACs 11, 13 sequentially, and the SAR 17 converts the corresponding digital bits ($B_1$ to $B_{10}$) based on the comparison result of the comparator 15.

Specifically, the SAR 17 traditionally comprises a logic circuit 171 which receives and calculates the comparison results outp, outn from the comparator 15 to determine the voltage level of the switches $S_{Pi}$, $S_{Ni}$ in each comparison phase. FIG. 2 illustrates a conventional logic circuit for controlling the switches. As shown in FIG. 2, the generated comparison results outp, outn in each comparison. phase must be calculated through at least one NAND gate 1711, two D-FF 1712, 1713, and one AND gate 1714, then the signal which control the switches $S_{P9}$, $S_{N9}$ can be obtained. The nature delay of the above digital logic gates may spend a lot of time, and it must determine how to switch the next switches $S_{Pi}$, $S_{Ni}$ via the logic circuit 171 after converting each digital bit. The more the number of converting bits of the ADC is, the larger the generated delay is, so that the conversion time in overall SAR ADC system may be greatly increased.

Therefore, with IC design, a need has arisen to propose a novel circuit which can decrease conversion time of the digital bits, so as to enable the designed circuit to achieve high conversion rate and performance.

SUMMARY OF THE INVENTION

In view of the foregoing, it is an object of the present invention to provide a successive approximation register (SAR) ADC, which utilizes multiplexer to control switches, so as to enable the designed circuit to achieve high conversion rate and performance.

According to one embodiment, a successive approximation ADC (SAR ADC) for increasing conversion rate is provided. The SAR ADC includes a first digital to analog converter (DAC), a SAR control logic ("SAR"), a comparator and a first multiplexer. The first digital to analog converter (DAC) comprises a first capacitor array with binary weighted values and a plurality of first switches, wherein the capacitors of the first capacitor array are one-to-one corresponding to the first switches. The SAR control logic is configured to control to enter into a sequence of comparison phases sequentially. The comparator, coupled to the first DAC, is configured to output a first comparison result based on a first comparison voltage of the first DAC and a second comparison voltage. The first multiplexer, coupled between the comparator and the SAR control logic, is configured to select one of the first switches, based on the currently comparison phase entered by the SAR control logic, to be switched directly according to the first comparison result.

According to another embodiment, a method for a successive approximation register ADC which includes at least one capacitor array and a plurality of switches is provided, wherein the capacitors of the capacitor array are one-to-one corresponding to the switches. The method comprises the following steps: firstly, at least one multiplexer is configured. Then, a first comparison voltage is outputted based on the terminal voltages on the terminals of the capacitor array, and a comparison result is outputted according to the first comparison voltage and a second comparison voltage. Afterwards, a sequence of comparisons is controlled based on the comparison result to enter into a sequence of comparison phases. Finally, the switches are selected in order, by the multiplexer based on the comparison phases, to be switched directly according to the comparison result.

DETAILED DESCRIPTION OF THE INVENTION

Figure 1:
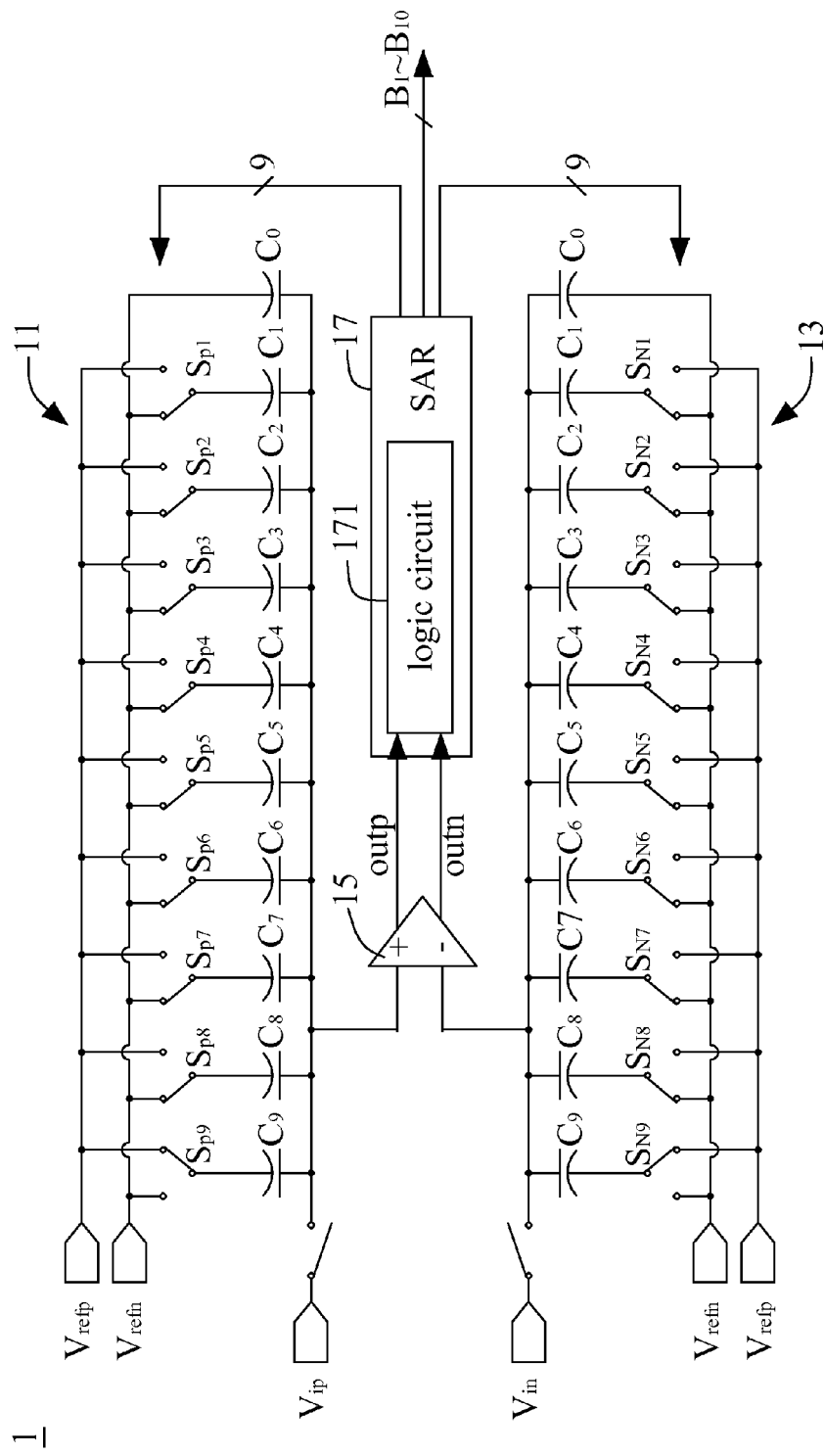
FIG. 1 illustrates a conventional 10-bit successive approximation register (SAR) ADC.
Figure 2:
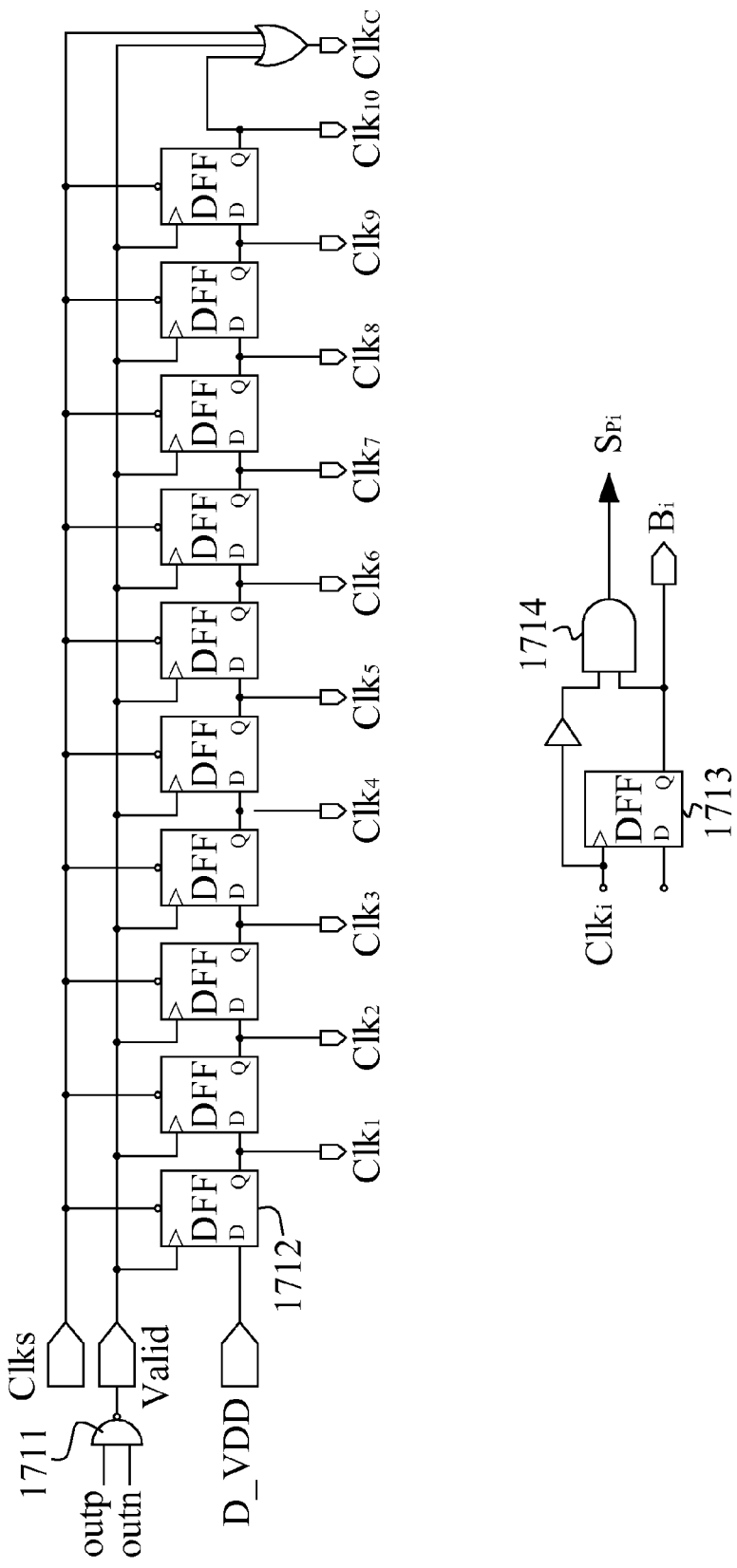
FIG. 2 illustrates a conventional logic circuit for controlling the switches.
Figure 3:
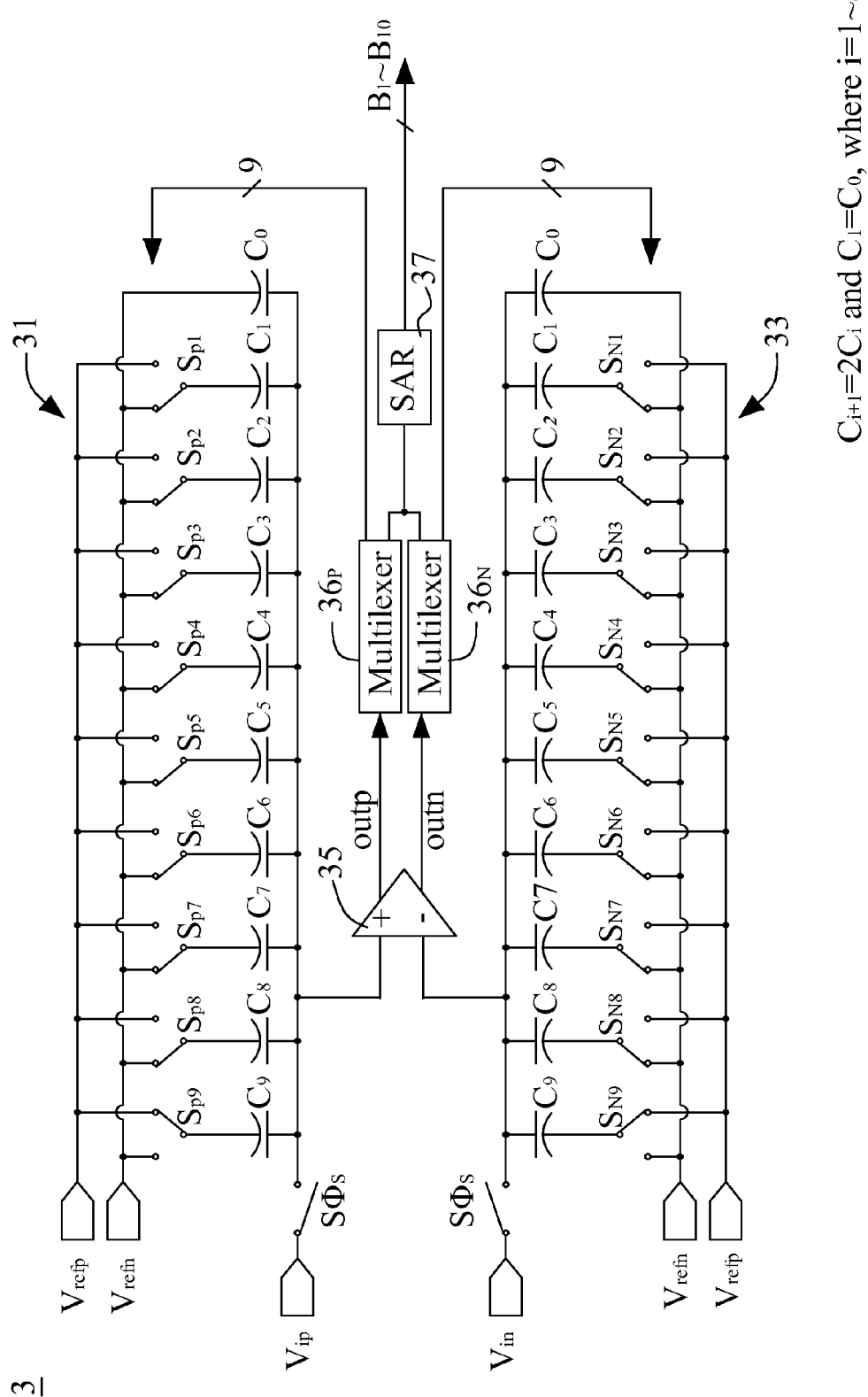
FIG. 3 illustrates a successive approximation ADC for increasing conversion rate according to one embodiment of the present invention.

Firstly, with reference to the drawings, FIG. 3 illustrates a successive approximation ADC (SAR ADC) 3 for increasing conversion rate according to one embodiment of the present invention. As shown in FIG. 3, the SAR ADC 3 includes a first digital to analog converter (DAC) 31, a second digital to analog converter (DAC) 33, a comparator 35, a first multiplexer $36_P$, a second multiplexer $36_N$ and a SAR control logic ("SAR") 37. The first DAC 31 includes a first capacitor array $C_9$ to $C_0$ with binary weighted values and a plurality of first switches $S_{P9}$ to $S_{P1}$, wherein the capacitors $C_9$ to $C_1$ of the first capacitor array are one-to-one corresponding to the first switches $S_{P9}$ to $S_{P1}$. Similarly, the second DAC 33 includes a second capacitor array $C_9$ to $C_0$ with binary weighted. values and a plurality of second switches $S_{N9}$ to $S_{N1}$, wherein the capacitors $C_9$ to $C_1$ of the second capacitor array are one-to-one corresponding to the second switches. In a perfect situation, the first and second arrays of capacitors $C_9$ to $C_1$ are with binary weighted values.

The comparator 35 has an inverting input terminal and a non-inverting (e.g., positive) input terminal which receive the outputs of the first DAC 31 and the second DAC 33, respectively, and then compare them. The SAR 37 is configured to generate a sequence of clock signals ($\Phi_1$-$\Phi_9$) to control to enter into a sequence of comparison phases sequentially. In each comparison phase, the comparator 35 outputs a first comparison result (outp) and a second comparison result (outn) based on a first comparison voltage outputted from the first DAC 31 and a second comparison voltage outputted from the second DAC 33.

The first multiplexer $36_P$ and the second multiplexer $36_N$ are coupled between the comparator 35 and the SAR 37, and each of them is configured to select one of the switches, based on the currently comparison phase entered by the SAR 37, to be switched directly according to the comparison result, so as to control the corresponding capacitor of the capacitor array to couple to a first reference voltage $V_{refp}$ or a second reference voltage $V_{refn}$.

Figure 4:
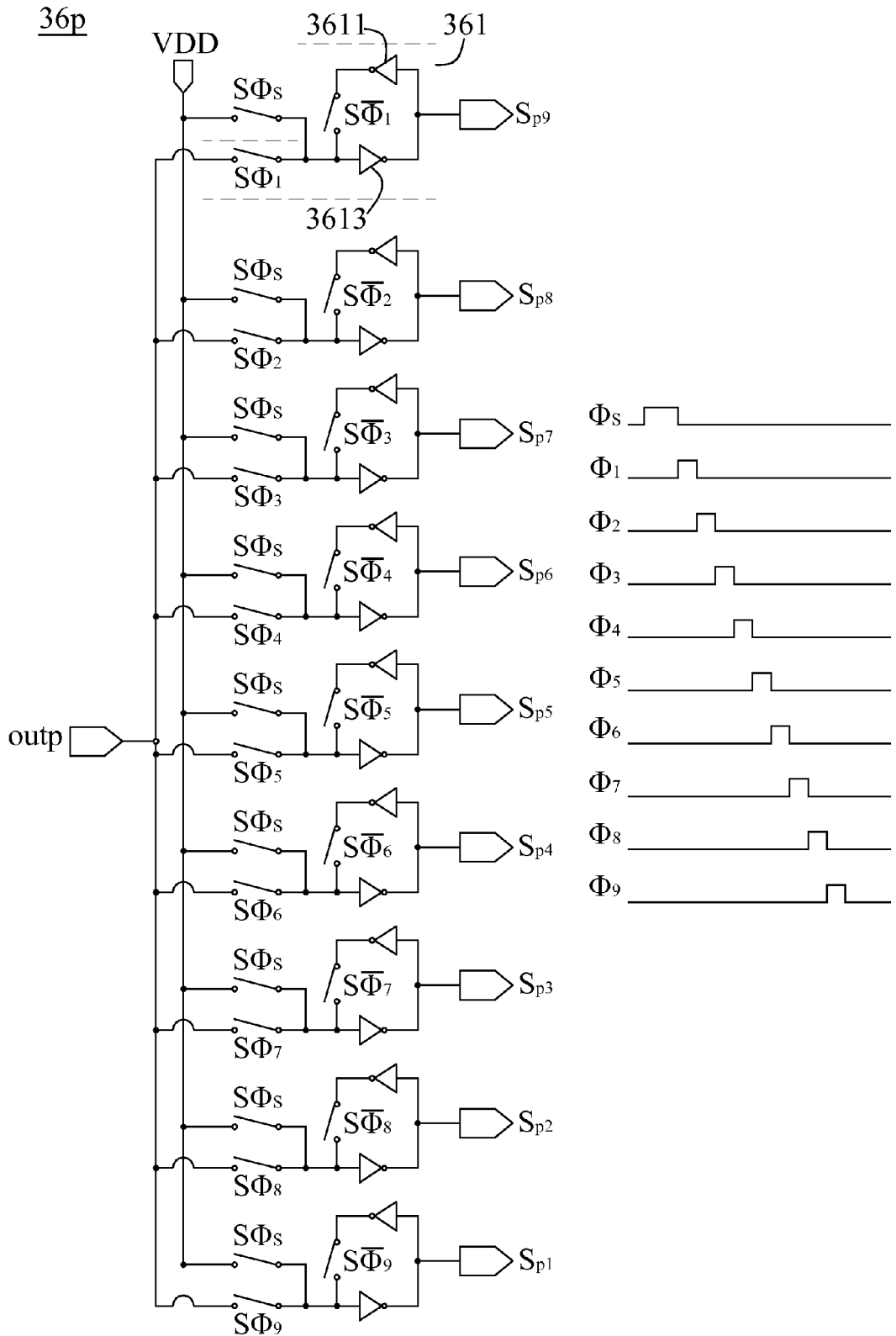
FIG. 4 illustrates a first multiplexer according to one embodiment of the present invention.

FIG. 4 takes the first multiplexer $36_P$ for brevity with the first DAC 31 for example to facilitate understanding. As shown in FIG. 4, the first multiplexer $36_P$ includes a plurality of latch circuits 361 which are one-to-one corresponding to the first switches $S_{Pi}$. Each of the latch circuits 361 includes a latch switch $S\Phi_i$ and two inverters 3611, 3613, coupled in opposite directions through the latch switch $S\overline{\Phi}_i$, wherein the latch switch $S\Phi_i$ is coupled between the end of the first comparison result (outp), outputted by the comparator 35, and the inverters 3611, 3613.

In every comparison phase, the first multiplexer $36_P$ controls the selected first switch $S_{Pi}$ to be switched directly as the first comparison result (outp) outputted by the comparator 35. Specifically, the first multiplexer $36_P$ turns on the latch circuits 361 sequentially based on the sequence of comparison phases, and then outputs all of the first comparison results, generated in the sequence of comparison phases, sequentially to switch the corresponding first switches $S_{Pi}$. For example, once the SAR 37 generates the clock signals $\Phi_1$ to enter into the first comparison phase, the first multiplexer $36_P$ will turn on the latch switch $S\Phi_1$ to output the first comparison result (outp), outputted in the first comparison, phase, to switch the corresponding first switch $S_{P9}$ to the first reference voltage $V_{refp}$ or the second reference voltage $V_{refn}$. The switched first switch $S_{P9}$ controls the terminal voltage on the terminal of the capacitor $C_9$ of the first capacitor array to accordingly generate the first comparison voltage in the next comparison phase.

Figure 5:
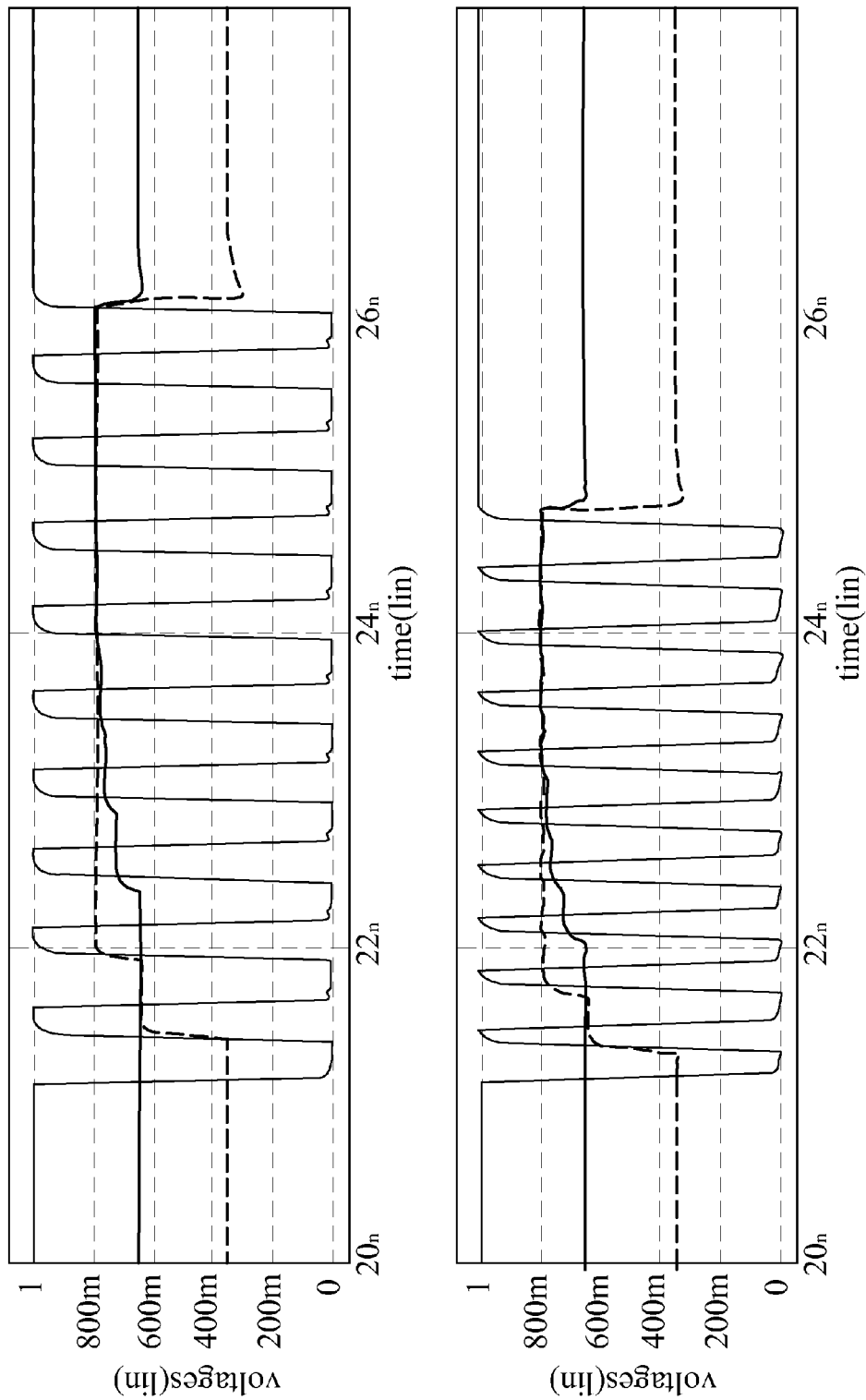
FIG. 5 illustrates a simulation result of conversion time according to one embodiment of the present invention.

Similarly, when the SAR 37 generates the clock signals $\Phi_2$ to enter into the second comparison phase, the first multiplexer $36_P$ turns on the latch switch $S\Phi_2$ to output the first comparison result (outp), outputted in the second comparison phase, to switch the corresponding first switch $S_{P8}$. Repeat above operation, the first multiplexer $36_P$ turns on the latch switches $S\Phi_1$ to $S\Phi_9$ sequentially to output the first comparison result (outp) to switch the corresponding first switch $S_{P9}$ to $S_{P1}$. Wherein, the first multiplexer $36_P$ only selects one of the first switches $S_{Pi}$ to be switched in each comparison phase. Because the first switches $S_{Pi}$ are controlled by the first comparison results (outp) directly, it increases conversion rate and reduces conversion time when the SAR 37 outputs the corresponding digital bits $B_1$-$B_{10}$ based on the first comparison results (outp) generated. in the sequence of comparison phases. Compare with the traditional determination of digital logic for controlling the switches, the present invention can decrease 20% conversion rate by using the multiplexers to select to switch the switches, as shown in FIG. 5.

In one embodiment, there are a plurality of sample switches $S\Phi_s$ in the first DAC 31 and the first multiplexer $36_P$. Each one sample switch $S\Phi_s$ in the first multiplexer $36_P$ is coupled between a voltage end VDD and the corresponding each latch circuit 361 (as shown in FIG. 4), which is configured to switch one end of the first capacitor array $C_9$ to $C_1$ to one of the first reference voltage $V_{refp}$ and the second reference voltage $V_{refn}$ when in a sample phase. Then (during the sample phase), the first DAC 31 samples the differential input voltage $V_{ip}$ through one sample switch $S\Phi_s$ in the first DAC 31 (as shown in FIG. 3). It is worth noting that the SAR 37 may be configured to generate a clock signal $\Phi_s$ to switch the sample switches $S\Phi_s$ for entering the sample phase. The second DAC 33 is symmetrically operated with the first DAC 31 in the sample phase and the sequence of comparison phases.

Figure 6:
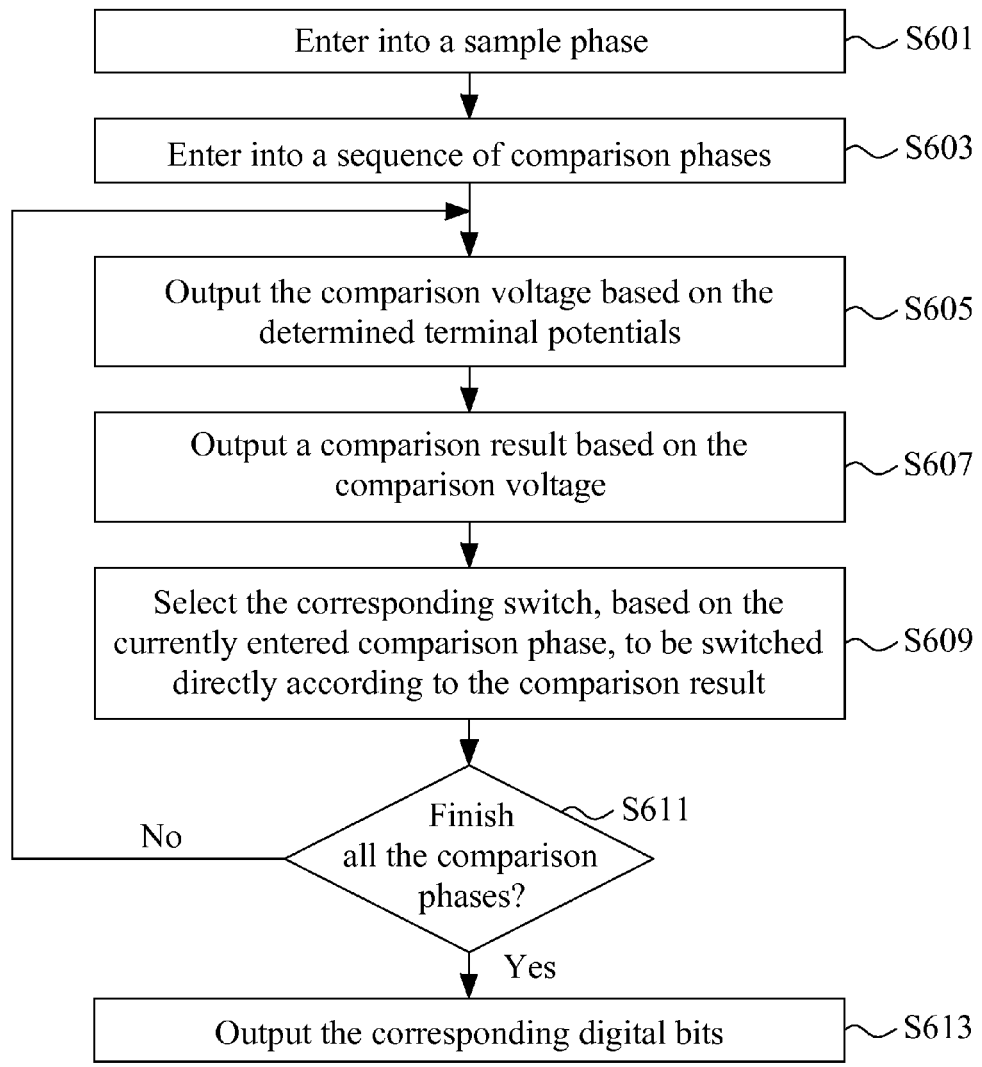
FIG. 6 shows a flow diagram illustrating a conversion rate increasing method according to one embodiment of the present invention.

Finally, with reference to FIG. 6, a flow diagram is provided illustrating a conversion rate increasing method according to one embodiment of the present invention. It is noted that FIG. 6 shows the flow of the first DAC 31 for brevity, and the second DAC 33 are symmetrically operated with the first DAC 31 as described above. The method is for the SAR ADC 3 in FIG. 3 which configures the first multiplexer $36_P$ and the second multiplexer $36_N$.

Firstly, in step S601, the SAR 37 controls to enter into the sample phase, so as to sample the differential input voltages $V_{ip}$, $V_{in}$. Afterwards, in step S603, the SAR 37 controls to enter into a sequence of comparison, phases, and the comparison voltage is outputted based on the determined terminal voltages in step S605. And in step S607, the comparator 35 compares the first comparison voltage generated by the first DAC 31 with the second comparison voltage generated by the second DAC 33 to output the comparison result (outp).

In step S609, when receiving the comparison result (outp), the first multiplexer $36_P$ selects the corresponding first switch $S_{Pi}$, based on the currently entered comparison phase, to be switched directly according to the comparison result. Wherein, the first multiplexer $36_P$ only selects one of the first switches $S_{Pi}$ to be switched in each comparison phase. For example, in the first comparison phase, the first multiplexer $36_P$ turns on the latch switch $S\Phi_1$ to output the comparison result (outp), outputted in the first comparison, phase, to switch the corresponding first switch $S_{P9}$. Accordingly, the terminal voltage on the terminal of the capacitors $C_9$ is determined based on the switched first switch $S_{P9}$.

Finally, in step S611, it determines whether all the comparison. phases have been finished or not. If no, flow returns to step S605 so as to proceed the following comparison phases. If finishing all the comparison phases, the SAR 37 outputs the corresponding digital bits $B_1$ to $B_{10}$ based on each outputted comparison result, in step S613.

According to the above embodiment, the successive approximation ADC for increasing conversion rate and method thereof, provided in the present invention, select the switch, which corresponds to the current comparison phases, by the multiplexer, and output the comparison result to directly control the selected switch. Therefore, it can decrease conversion time of the digital bits, so as to enable the designed circuit to achieve high conversion rate and performance.

Although specific embodiments have been illustrated and described, it will be appreciated by those skilled in the art that various modifications may be made without departing from the scope of the present invention, which is intended to be limited solely by the appended claims.

What is claimed is:

1. A successive approximation ADC (SAR ADC), comprising:

a first digital to analog converter (DAC) comprising a first capacitor array and a plurality of first switches, wherein the capacitors of the first capacitor array are one-to-one corresponding to the first switches;

SAR control logic configured to control to enter into a sequence of comparison phases sequentially;

a comparator, coupled to the first DAC, configured to output a first comparison result based on a first comparison voltage of the first DAC and a second comparison voltage; and a first multiplexer, coupled between the comparator and the SAR control logic, configured to select one of the first switches, based on the currently comparison phase entered by the SAR control logic, to be switched directly according to the first comparison result;

wherein the first multiplexer comprises a plurality of latch circuits which are one-to-one corresponding to the first switches.

2. The SAR ADC of claim 1, wherein the switched first switch controls the terminal voltages on the terminals of the first capacitor array to accordingly generate the first comparison voltage of the first DAC.

3. The SAR ADC of claim 2, wherein in each f the sequence of comparison phases, the first multiplexer controls the selected first switch to be switched directly as the first comparison result.

4. The SAR ADC of claim 1, wherein the first multiplexer turns on the latch circuits sequentially based on the sequence of comparison phases, and then sequentially outputs all of the first comparison results, generated in the sequence of comparison phases, to switch the corresponding first switches.

5. The SAR ADC of claim 4, wherein each of the latch circuits comprises two inverters, coupled in opposite directions, and a latch switch, wherein the latch switch is coupled between the output end of the first comparison result and the inverters.

6. The SAR ADC of claim 5, wherein the first multiplexer turns on the latch switches sequentially based on the sequence of comparison phases, so as to sequentially output the first comparison results, generated in the sequence of comparison phases, to switch the corresponding first switches.

7. The SAR ADC of claim 6, wherein the first multiplexer further comprises:

a sample switch, coupled. between a voltage end and each of the latch circuits, configured to control the first capacitor array to sample when in a sample phase.

8. The SAR ADC of claim 1, wherein the SAR control logic outputs the corresponding digital bits based on the first comparison results generated in the sequence of comparison phases.

9. The SAR ADC of claim 1, wherein the capacitors of the first capacitor array are with binary weighted values.

10. The SAR ADC of claim 3, further comprising:

a second digital to analog converter (DAC) comprising a second capacitor array and a plurality of second switches, wherein the capacitors of the second capacitor array are one-to-one corresponding to the second switches; and a second multiplexer, coupled between the comparator and the SAR control logic, configured to select one of the second switches, based on the currently comparison phase entered by the SAR control logic, to be switched directly;

wherein, the switched second switch controls the terminal voltages on the terminals of the second capacitor array to accordingly generate the second comparison voltage of the second DAC, and the second DAC is symmetrically operated with the first DAC in the sample phase and the sequence of comparison phases.

11. A method for a successive approximation ADC (SAR ADC) which comprises at least one capacitor array and a plurality of switches, wherein the capacitors of the capacitor array are one-to-one corresponding to the switches, and the method. comprising:

configuring at least one multiplexer;

outputting a first comparison voltage based on the terminal voltages on the terminals of the capacitor array;

outputting a comparison result based on the first comparison voltage and a second comparison voltage;

controlling a sequence of comparisons based on the comparison result to enter into a sequence of comparison phases; and selecting the switches in order, by the multiplexer based on the comparison phases, to be switched directly according to the comparison result;

wherein the multiplexer comprises a plurality of latch circuits which are one-to-one corresponding to the switches, and the multiplexer turns on the latch circuits sequentially based on the sequence of comparison phases, so as to sequentially output the comparison results, generated in the sequence of comparison phases, to switch the corresponding switches.

12. The method of claim 11, wherein the step of outputting the first comparison voltage comprises:

controlling the terminal voltages on the terminals of the capacitor array to accordingly generate the first comparison voltage;

wherein, the corresponding first comparison voltage is generated in each of the sequence of comparison phases.

13. The method of claim 12, wherein the step of selecting the switches to be switched directly according to the comparison result comprises:

controlling the switch which is selected by the multiplexer to be switched directly as the comparison result;

wherein, the multiplexer only selects one of the switches to be switched in each of the comparison phases.

14. The method of claim 13, further comprising:

outputting the corresponding digital bits based on the comparison results generated in the sequence of comparison phases.

* * * * *